United States Patent
Kim et al.

(10) Patent No.: US 8,137,995 B2
(45) Date of Patent: Mar. 20, 2012

(54) DOUBLE-SIDED SEMICONDUCTOR DEVICE AND METHOD OF FORMING TOP-SIDE AND BOTTOM-SIDE INTERCONNECT STRUCTURES

(75) Inventors: OhHan Kim, Kyunggi-Do (KR); JoungUn Park, Kyunggi-Do (KR); SunMi Kim, KyoungKi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 320 days.

(21) Appl. No.: 12/332,799

(22) Filed: Dec. 11, 2008

(65) Prior Publication Data

US 2010/0148353 A1  Jun. 17, 2010

(51) Int. Cl.
*H01L 21/00* (2006.01)

(52) U.S. Cl. ............ 438/12; 438/13; 438/39; 438/40; 438/41; 438/42; 438/43; 438/44; 438/115; 438/458; 438/459; 438/626; 438/631; 438/633; 438/689; 438/659

(58) Field of Classification Search .................. None
See application file for complete search history.

(56) References Cited

U.S. PATENT DOCUMENTS

| | | | |
|---|---|---|---|
| 3,648,131 A * | 3/1972 | Stuby ........................ | 257/622 |
| 3,909,678 A * | 9/1975 | Rifkin et al. ................ | 361/699 |
| 5,399,898 A * | 3/1995 | Rostoker .................... | 257/499 |
| 5,739,067 A * | 4/1998 | DeBusk et al. ............. | 438/618 |
| 6,322,903 B1 * | 11/2001 | Siniaguine et al. .......... | 428/617 |
| 6,911,392 B2 * | 6/2005 | Bieck et al. ................ | 438/667 |
| 7,459,393 B2 * | 12/2008 | Farnworth et al. .......... | 438/667 |
| 7,498,675 B2 * | 3/2009 | Farnworth et al. .......... | 257/723 |
| 7,514,797 B2 * | 4/2009 | Chen et al. ................ | 257/777 |
| 7,547,954 B2 * | 6/2009 | Geusic et al. .............. | 257/432 |
| 7,785,927 B2 * | 8/2010 | Chen et al. ................ | 438/109 |
| 7,791,175 B2 * | 9/2010 | Pyeon ...................... | 257/621 |
| 2003/0113979 A1 * | 6/2003 | Bieck et al. ................ | 438/411 |
| 2005/0042786 A1 * | 2/2005 | Bieck et al. ................ | 438/38 |
| 2008/0150063 A1 * | 6/2008 | Bieck et al. ................ | 257/432 |
| 2010/0065883 A1 * | 3/2010 | Bieck et al. ................ | 257/99 |
| 2010/0148353 A1 * | 6/2010 | Kim et al. .................. | 257/698 |

* cited by examiner

*Primary Examiner* — David Graybill
(74) *Attorney, Agent, or Firm* — Robert D. Atkins; Patent Law Group: Atkins & Associates, P.C.

(57) ABSTRACT

A semiconductor device is made by forming a first active device on a first side of a semiconductor wafer. A first insulating layer is formed over the first side of the wafer. A first conductive layer is formed over the first insulating layer. A first interconnect structure is formed over the first insulating layer and first conductive layer. A temporary carrier is mounted to the first interconnect structure. A second active device is formed on a second side of the semiconductor wafer. A second insulating layer is formed over the second side of the wafer. A second conductive layer is formed over the second insulating layer. A second interconnect structure is formed over the second insulating layer and second conductive layer. The temporary carrier is removed, leaving a double-sided semiconductor device. The double-sided semiconductor device is enclosed in a package with the first and second interconnect structures electrically connected.

21 Claims, 9 Drawing Sheets

DOUBLE-SIDED SEMICONDUCTOR DEVICE AND METHOD OF FORMING TOP-SIDE AND BOTTOM-SIDE INTERCONNECT STRUCTURES

FIELD OF THE INVENTION

The present invention relates in general to semiconductor devices and, more particularly, to a double-sided semiconductor device with top-side and bottom-side interconnect structures.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In most semiconductor devices, the active region is formed on one side of the substrate. The active region is electrically connected to other devices through an interconnect structure. Customer demand calls for more devices, interconnect capability, and circuit functionality per die. The approach of forming the active region only on one side of the substrate limits the number of devices that can be placed on the die as well as reducing interconnect routing options. These limitations are particularly true in multi-functional devices such as memory and application specific integrated circuits (ASIC).

SUMMARY OF THE INVENTION

A need exists for a semiconductor device with a greater number of circuit elements and interconnect options. Accordingly, in one embodiment, the present invention is a method of manufacturing a semiconductor device comprising the steps of providing a semiconductor wafer, forming a first active device on a first side of the semiconductor wafer, forming a first insulating layer over the first side of the semiconductor wafer, forming a first conductive layer over the first insulating layer, and forming a first interconnect structure over the first insulating layer and first conductive layer. The first interconnect structure is electrically connected to the first active device through the first conductive layer. The method further includes the steps of mounting a temporary carrier to the first interconnect structure, forming a second active device on a second side of the semiconductor wafer opposite the first side of the semiconductor wafer, forming a second insulating layer over the second side of the semiconductor wafer, forming a second conductive layer over the second insulating layer, and forming a second interconnect structure over the second insulating layer and second conductive layer. The second interconnect structure is electrically connected to the second active device through the second conductive layer. The method further includes the step of removing the temporary carrier.

In another embodiment, the present invention is a method of manufacturing a semiconductor device comprising the steps of providing a semiconductor wafer, forming a first active device on a first side of the semiconductor wafer, and forming a first interconnect structure over the first side of the semiconductor wafer. The first interconnect structure is electrically connected to the first active device. The method further includes the steps of mounting a temporary carrier to the first interconnect structure, forming a second active device on a second side of the semiconductor wafer opposite the first side of the semiconductor wafer, and forming a second interconnect structure over the second side of the semiconductor wafer. The second interconnect structure is electrically connected to the second active device. The method further includes the step of removing the temporary carrier.

In another embodiment, the present invention is a method of manufacturing a semiconductor device comprising the steps of providing a semiconductor wafer, forming a first active device on a first side of the semiconductor wafer, and forming a first interconnect structure over the first side of the semiconductor wafer. The first interconnect structure is electrically connected to the first active device. The method further includes the steps of forming a second active device on a second side of the semiconductor wafer opposite the first side of the semiconductor wafer, and forming a second interconnect structure over the second side of the semiconductor wafer. The second interconnect structure is electrically connected to the second active device.

In another embodiment, the present invention is a semiconductor device comprising a first substrate and first active device formed on a first side of the first substrate. A first interconnect structure is formed over the first side of the first substrate. The first interconnect structure is electrically connected to the first active device. A second active device is formed on a second side of the first substrate opposite the first side of the first substrate. A second interconnect structure is formed over the second side of the first substrate. The second interconnect structure is electrically connected to the second active device.

DETAILED DESCRIPTION OF THE DRAWINGS

Figure 1:
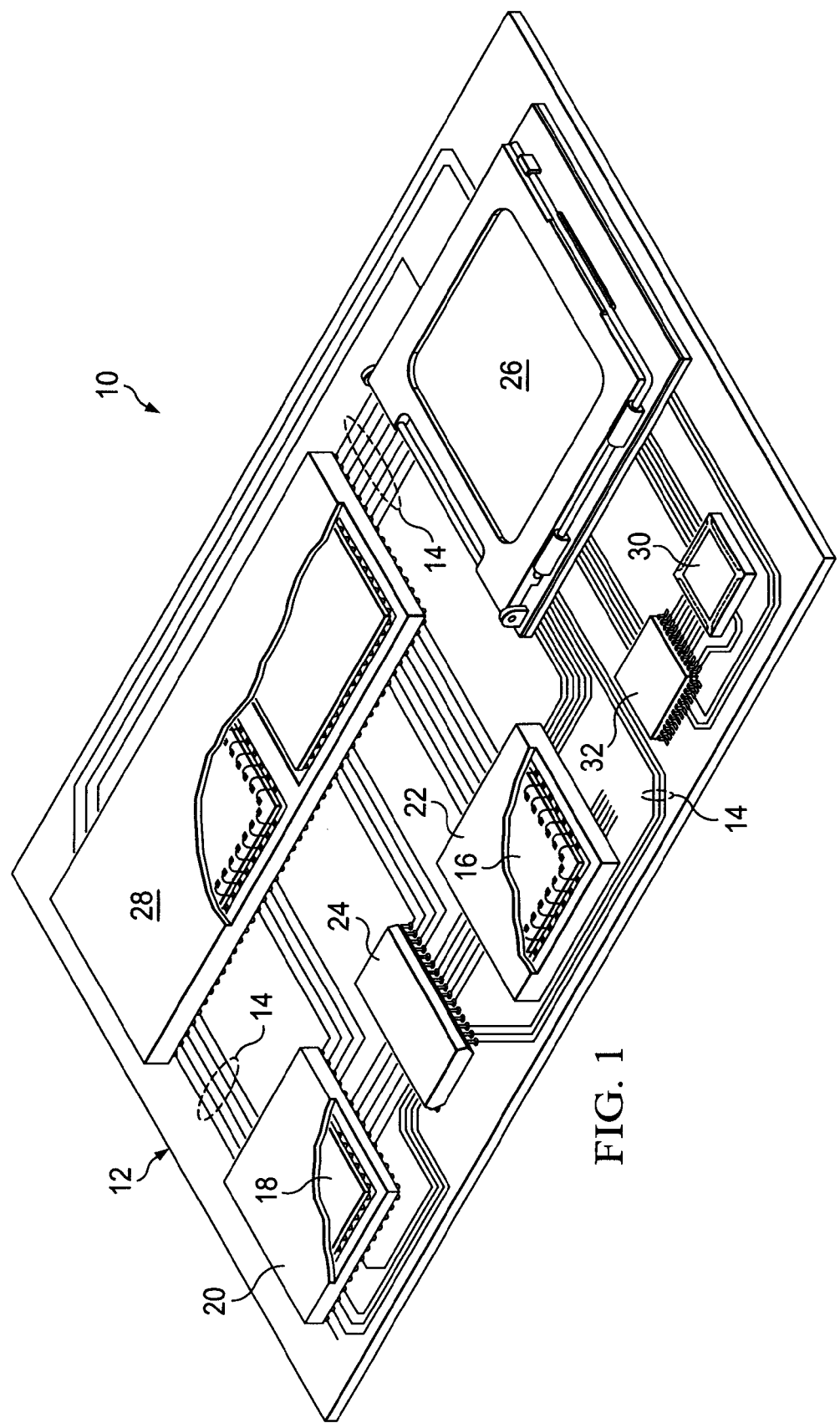
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
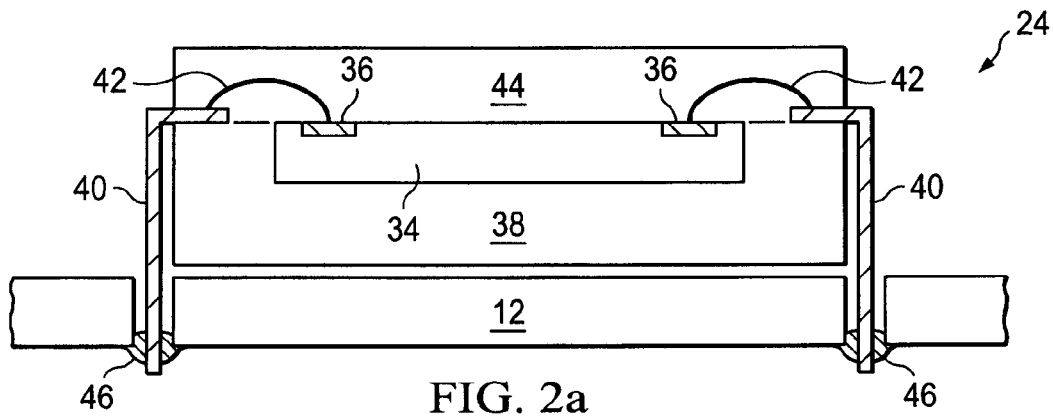
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
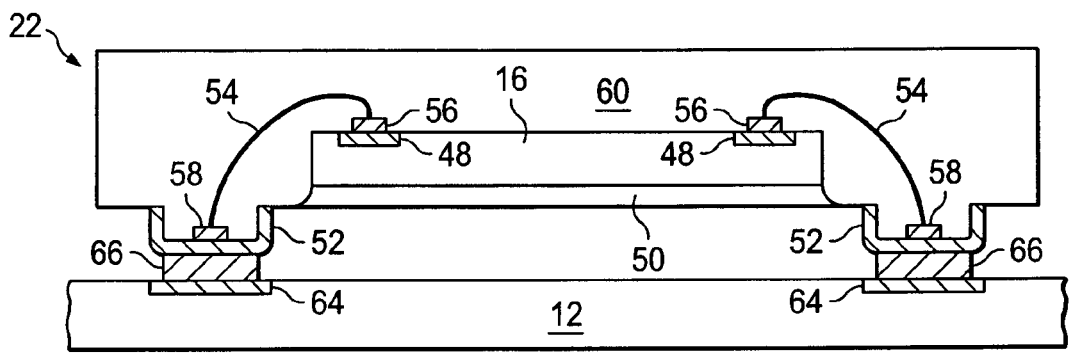

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
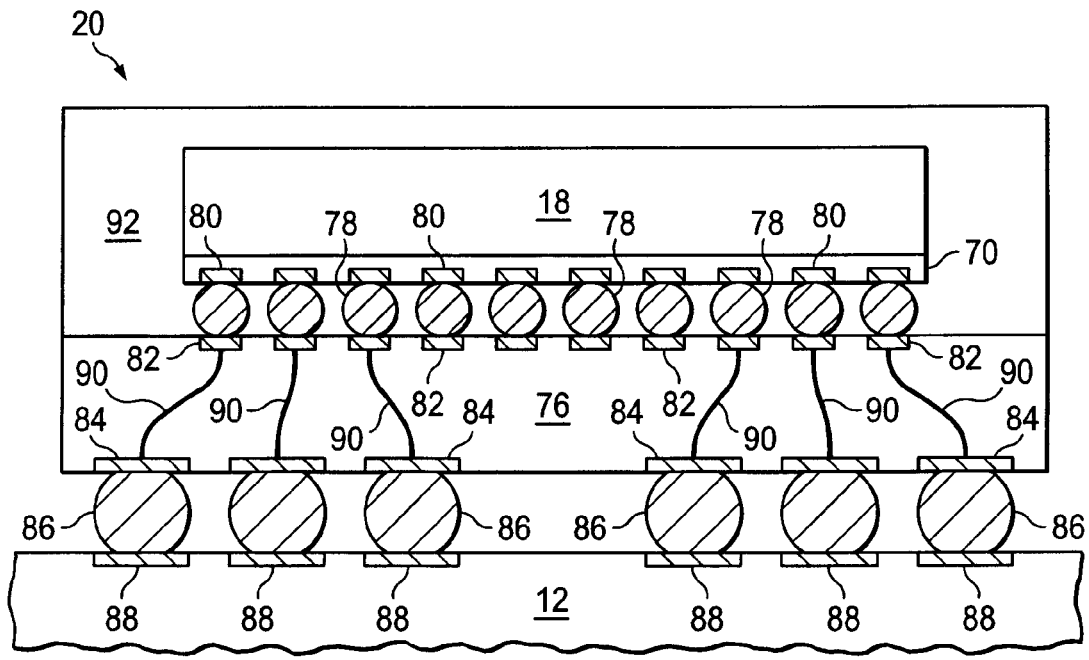

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
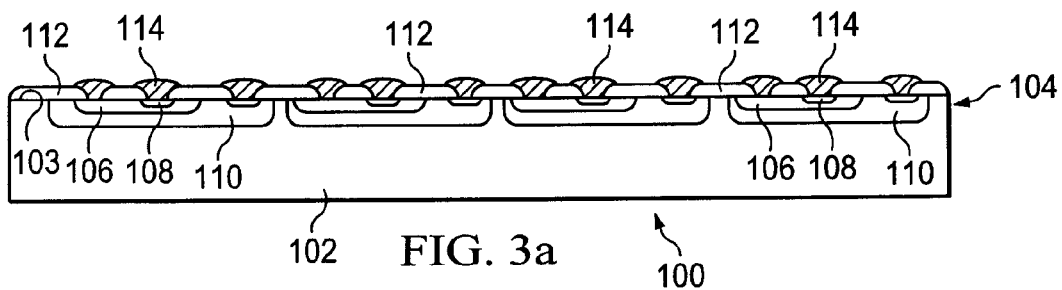
FIGS. 3a-3g illustrate a process of forming a double-sided semiconductor device with top-side and bottom-side interconnect structures.

FIGS. 3a-3g illustrate a process of forming a double-sided or double-face semiconductor die with top-side and bottom-side interconnect structures on wafer 100. In FIG. 3a, a semiconductor wafer 100 is made with silicon, gallium arsenide, or other bulk semiconductor material 102. A plurality of semiconductor die is formed on wafer 100 using semiconductor manufacturing processes described above. Each semiconductor die contains analog or digital circuits formed in active region 104. In one embodiment, the active devices include bipolar transistors, each having a base, emitter, and collector diffused into bulk semiconductor material 102. For example, p-type semiconductor region 106 represents a base region of an NPN bipolar transistor. The n-type semiconductor region 108 represents an emitter region, and n-type semiconductor region 110 represents a collector region. Active region 104 can contain PNP semiconductor devices. The semiconductor die may also contain other active devices and integrated passive devices (IPD), such as inductors, capacitors, and resistors, in active region 104.

An insulating layer 112 is formed on surface 103 of wafer 100 over active region 104. The insulating layer 112 can be silicon dioxide (SiO2), silicon nitride (Si3N4), silicon oxynitride (SiON), tantalum pentoxide (Ta2O5), zircon (ZrO2), aluminum oxide (Al2O3), or other material having suitable insulating properties. The insulating layer 112 is patterned or blanket deposited using PVD, CVD, printing, sintering, or thermal oxidation. In one embodiment, passivation layer 112 is formed by selective oxidation with dry oxygen. The insulating layer 112 can be made with single or multiple layers. A portion of insulating layer 112 is removed by an etching process to expose semiconductor regions 106-110.

An electrically conductive layer 114 is formed over semiconductor regions 106-110 in the removed portions of insulating layer 112 using a patterning and deposition process. Conductive layer 114 is Al, Cu, Sn, Ni, Au, Ag, or other suitable material. The deposition of conductive layer 114 uses PVD, CVD, electrolytic plating, or electroless plating process. Each portion of conductive layer 114 is electrically isolated or electrically common according to the design of the die.

Figure 3B:
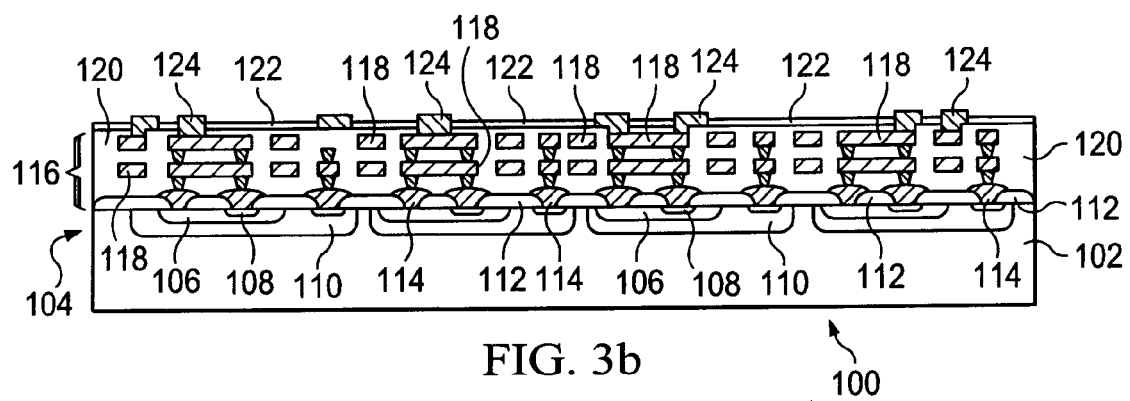

In FIG. 3b, a top-side interconnect structure 116 is formed over insulating layer 112 and conductive layer 114. The interconnect structure 116 includes conductive layers and signal traces 118, which are separated by insulating layer 120. The insulating layer 120 is Si3N4, SiO2, SiON, Ta2O5, ZnO, ZrO2, Al2O3, or other suitable dielectric material. The interconnect structure 116 electrically connects to the active and passive devices within active region 104, including semiconductor regions 106-110, to form functional electrical circuits according to the electrical design and function of the semiconductor die.

A passivation layer 122 is formed over interconnect structure 116. Passivation layer 122 can be polyimide, SiO2, Si3N4, SiON, Ta2O5, Al2O3, benzocyclobutene (BCB), polybenzoxazoles (PBO), or other suitable material having similar insulating and structural properties. The deposition of passivation layer 122 may involve PVD, CVD, printing, sintering, or thermal oxidation. A portion of passivation layer 122 is removed by an etching process to expose conductive layer 118.

An electrically conductive layer 124 is formed over interconnect structure 116 in the removed portions of passivation layer 122 using a patterning and deposition process. Conductive layer 124 is Al, Cu, Sn, Ni, Au, Ag, or other suitable material. The deposition of conductive layer 124 uses PVD, CVD, electrolytic plating, or electroless plating process. Conductive layer 124 electrically connects to conductive layer 118 according to the electrical design and function of the die.

Figure 3C:
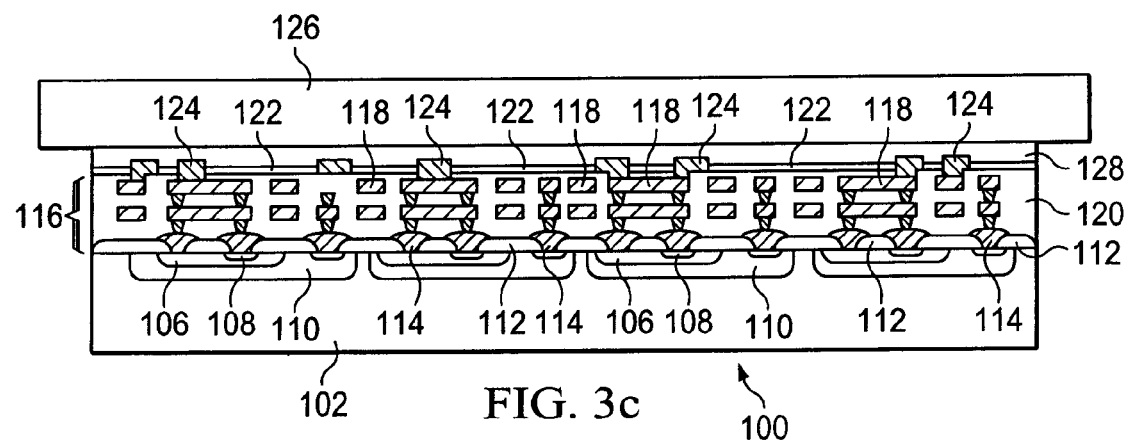

FIG. 3c shows a temporary process carrier or substrate 126 mounted to interconnect structure 116 with an adhesive layer 128. Carrier 126 contains dummy or sacrificial base material such as silicon, ceramic, glass, metal, or other suitable low-cost, rigid material. Adhesive layer 128 can be thermal epoxy, polymer composite, or inorganic bonding compounds.

Figure 3D:
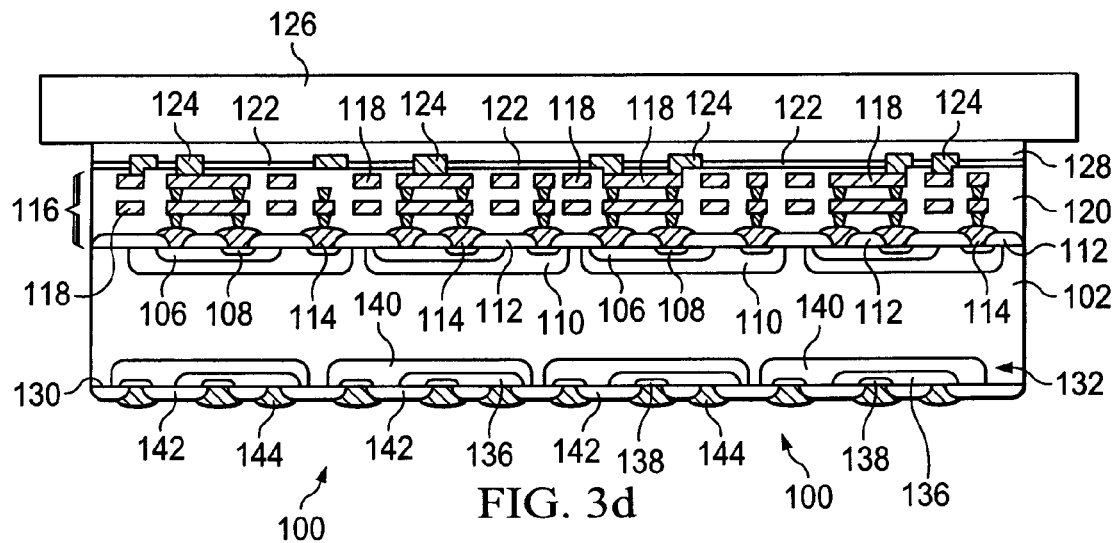

In FIG. 3d, back surface 130 of semiconductor wafer 100 undergoes CMP to remove defects. Analog or digital circuits are then formed in active region 132 on surface 130. In one embodiment, the active devices include bipolar transistors, each having a base, emitter, and collector diffused into surface 130. The p-type semiconductor region 136 represents a base region of an NPN bipolar transistor. The n-type semiconductor region 138 represents an emitter region, and n-type semiconductor region 140 represents a collector region. The semiconductor die may also contain other active devices and IPDs in active region 132.

An insulating layer 142 is formed over active devices 132. The insulating layer 142 can be SiO2, Si3N4, SiON, Ta2O5, ZrO2, Al2O3, or other material having suitable insulating properties. The insulating layer 142 is patterned or blanket deposited using PVD, CVD, printing, sintering, or thermal oxidation. In one embodiment, insulating layer 142 is formed by selective oxidation with dry oxygen. The insulating layer 142 can be made with single or multiple layers. A portion of insulating layer 142 is removed by an etching process to expose semiconductor regions 136-140.

An electrically conductive layer 144 is formed over semiconductor regions 136-140 in the removed portions of insulating layer 142 using a patterning and deposition process. Conductive layer 144 is Al, Cu, Sn, Ni, Au, Ag, or other suitable material. The deposition of conductive layer 144 uses PVD, CVD, electrolytic plating, or electroless plating process. Each portion of conductive layer 144 is electrically isolated or electrically common according to the design of the die.

Figure 3E:
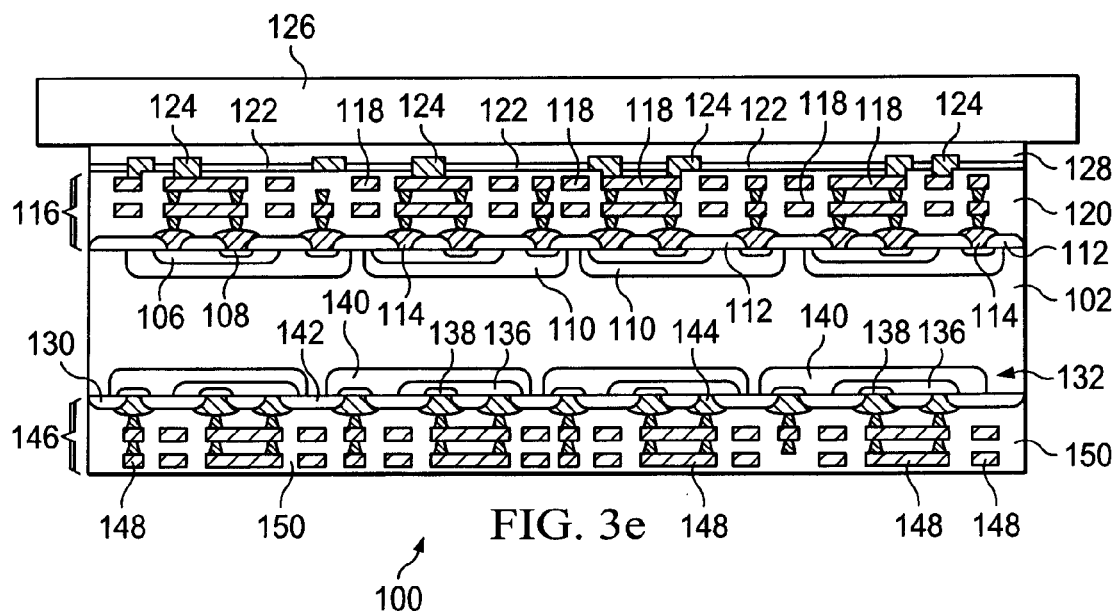

In FIG. 3e, a bottom-side interconnect structure 146 is formed over insulating layer 142 and conductive layer 144. The interconnect structure 146 includes conductive layers and signal traces 148, which are separated by insulating layer 150. The insulating layer 150 is Si3N4, SiO2, SiON, Ta2O5, ZnO, ZrO2, Al2O3, or other suitable dielectric material. The interconnect structure 146 electrically connects the active and passive devices within the semiconductor die, including semiconductor regions 136-140, to form functional electrical circuits according to the electrical design and function of the die.

Figure 3F:
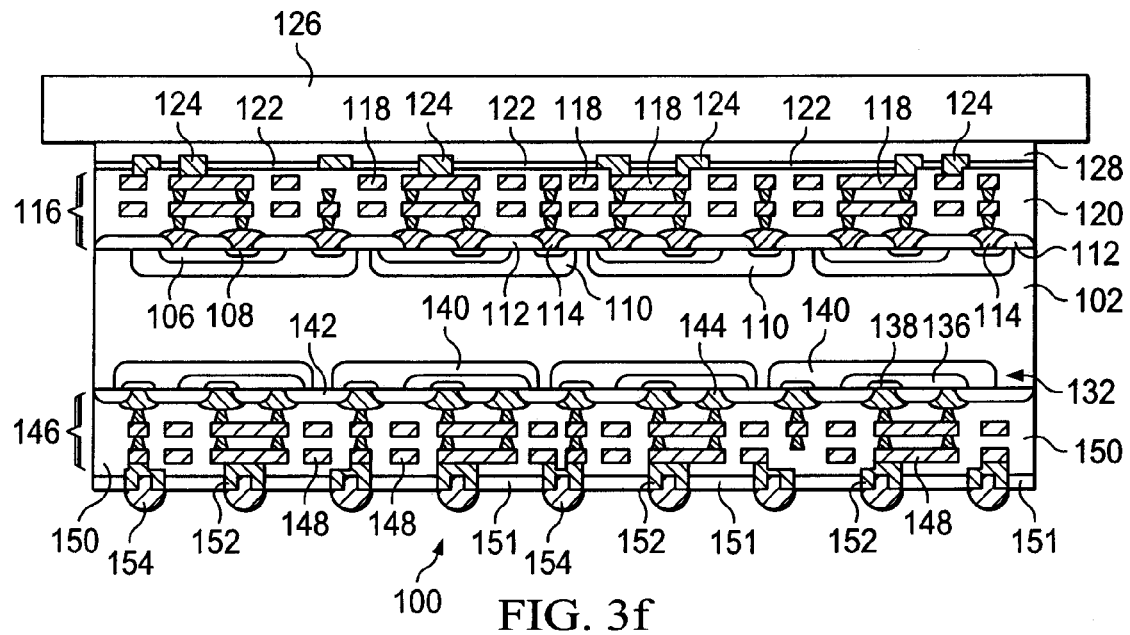

In FIG. 3f, an insulating layer 151 is formed over interconnect structure 146. The insulating layer 151 can be SiO2, Si3N4, SiON, Ta2O5, ZrO2, Al2O3, or other material having suitable insulating properties. The insulating layer 151 is patterned or blanket deposited using PVD, CVD, printing, sintering, or thermal oxidation. A portion of insulating layer 151 is removed by an etching process to expose conductive layer 148.

An electrically conductive layer 152 is formed over conductive layer 148 in the removed portion of insulating layer 151 using a patterning and deposition process. Conductive layer 152 is Al, Cu, Sn, Ni, Au, Ag, or other suitable material. The deposition of conductive layer 152 uses PVD, CVD, electrolytic plating, or electroless plating process. Conductive layer 152 operates as an under bump metallization layer (UBM) and electrically connects to conductive layer 148.

An electrically conductive solder material is deposited over UBM 152 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 154. In some applications, solder bumps 154 are reflowed a second time to improve electrical contact to UBM 152. Solder bumps 154 represent one type of interconnect structure that can be formed on UBM 152. The interconnect structure can also use bond wires, 3D interconnects, conductive paste, or other electrical interconnect.

Figure 3G:
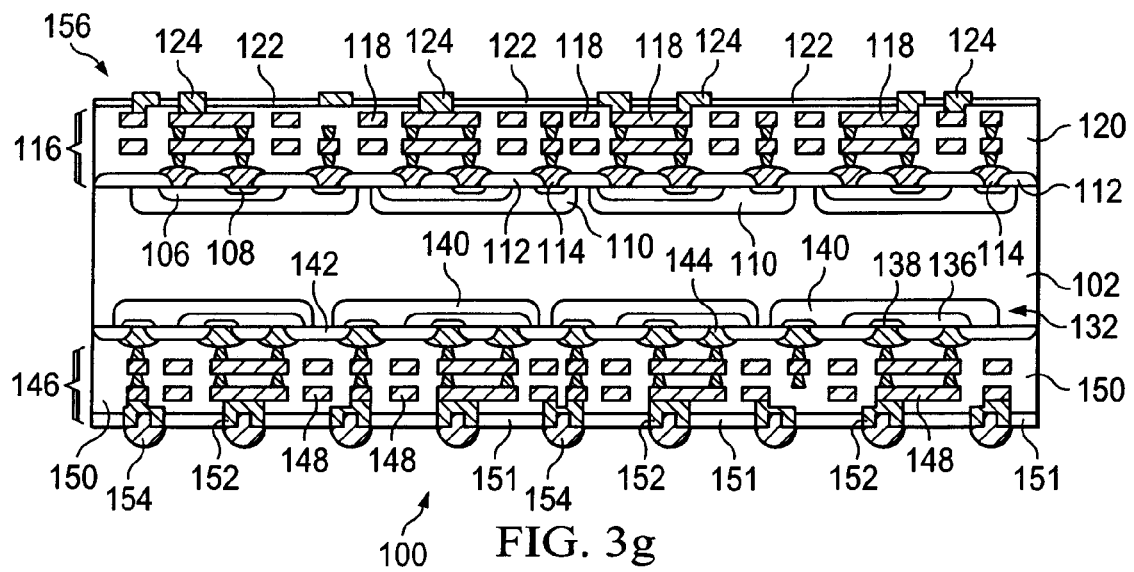

The temporary carrier 126 and adhesive layer 128 are removed in FIG. 3g by chemical etching, mechanical peel-off, CMP, or mechanical grinding. The resulting double-face or double-sided semiconductor die 156 provides high-density, multi-functional integrated circuits, such as memory or application specific integrated circuits (ASIC). By placing active and passive devices on both sides of the wafer with respective interconnect structures, the semiconductor die can provide greater circuit functionality and interconnect capability.

Figure 4:
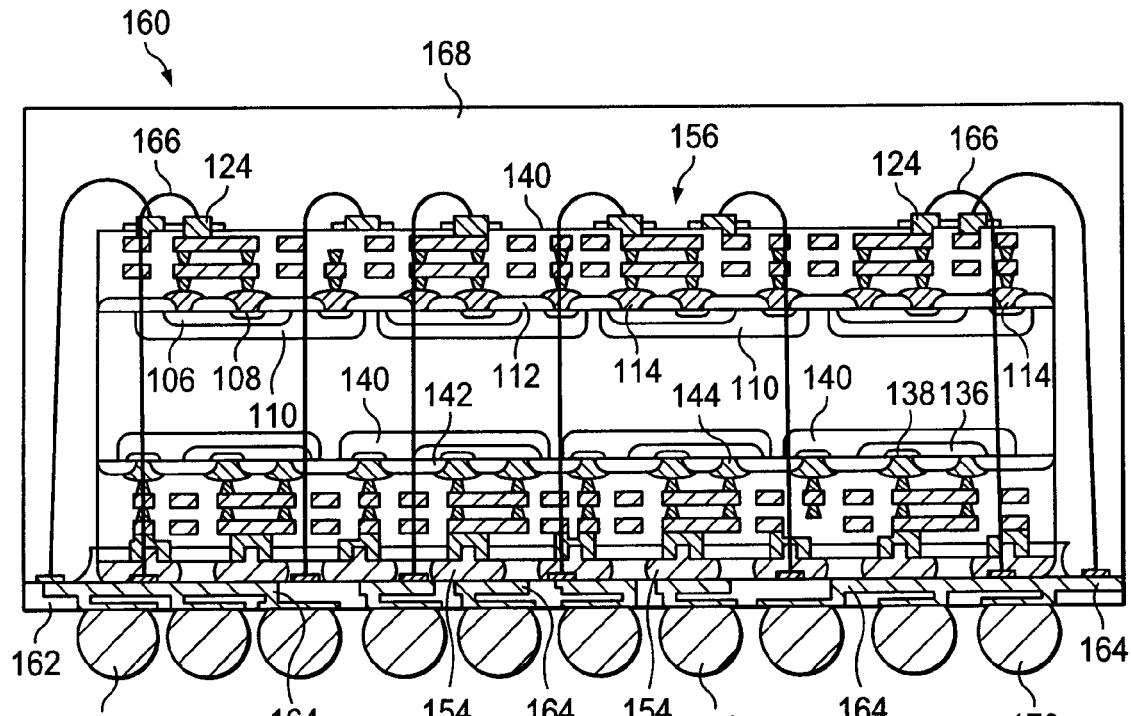
FIG. 4 illustrates the double-sided semiconductor device with top-side and bottom-side interconnect structures contained in a package.

FIG. 4 shows a semiconductor package 160 with double-sided or double-face semiconductor die 156 mounted to substrate 162. Solder bumps 154 electrically connect semiconductor package 160 to interconnect structure 164 of substrate 162. Bond wires 166 electrically connect conductive layer 124 and interconnect structure 116 to interconnect structure 164 of substrate 162.

An encapsulant or molding compound 168 is deposited over double-face semiconductor die 156 using a printing, compressive molding, transfer molding, liquid encapsulant molding, or other suitable applicator. Encapsulant 168 can be epoxy resin, epoxy acrylate, polymer, or polymer composite material. Encapsulant 168 is non-conductive and environmentally protects the semiconductor device from external elements and contaminants.

An electrically conductive solder material is deposited over contact pads of interconnect structure 164 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 170. Solder bumps 170 represent one type of interconnect structure that can be formed on the contact pads of interconnect structure 164. The interconnect structure can also use bond wires, 3D interconnects, conductive paste, or other electrical interconnect. The semiconductor regions 106-110 and 136-140 electrically connect to external devices through interconnect structures 116, 146, and 164, solder bumps 152 and 170, and bond wires 166.

Figure 5C:
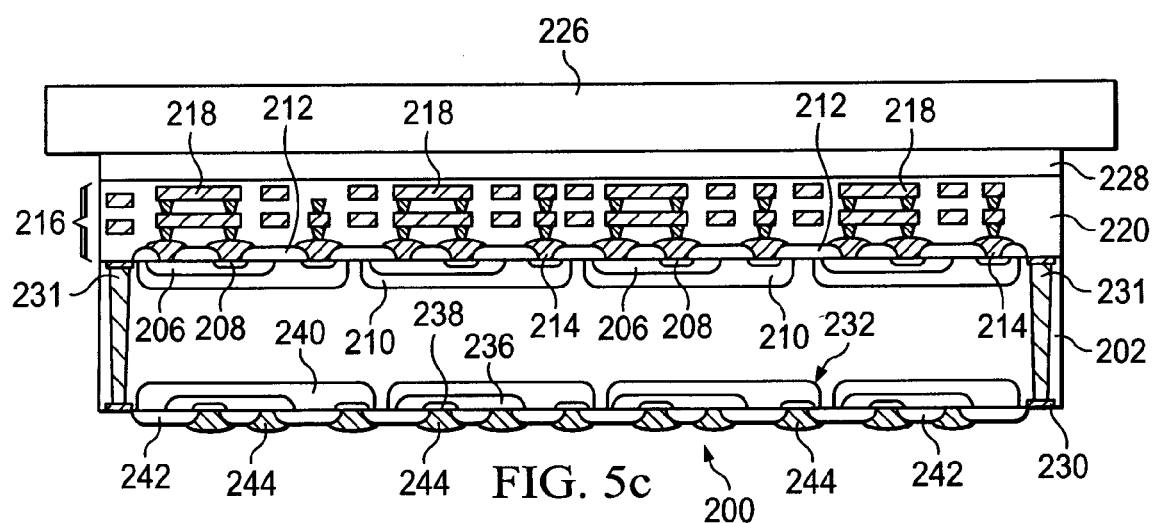
FIGS. 5a-5f illustrate a process of forming a double-sided semiconductor device with top-side and bottom-side interconnect structures and THV.
Figure 5A:
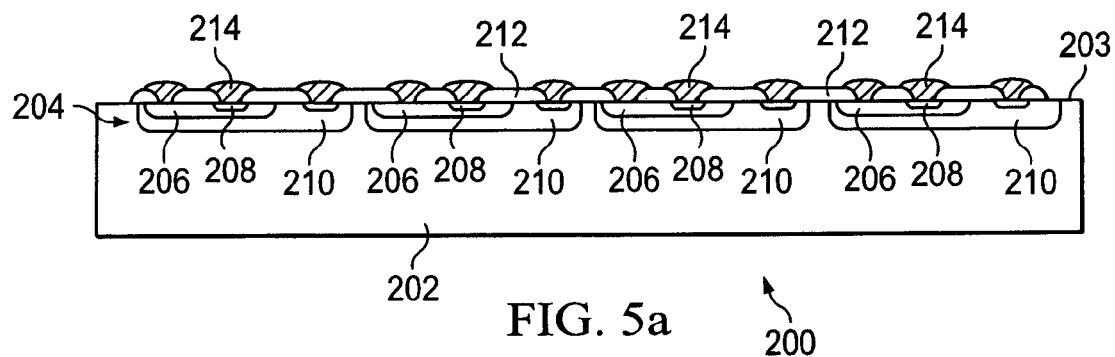

An alternate embodiment of forming the double-face semiconductor die with top-side and bottom-side interconnect structures is shown in FIGS. 5a-5f. In FIG. 5a, a semiconductor wafer 200 is made with silicon, gallium arsenide, or other bulk semiconductor material 202. A plurality of semiconductor die is formed on wafer 200 using semiconductor manufacturing processes described above. Each semiconductor die contains analog or digital circuits formed in active region 204. In one embodiment, the active devices include bipolar transistors, each having a base, emitter, and collector diffused into bulk semiconductor material 202. The p-type semiconductor region 206 represents a base region of an NPN bipolar transistor. The n-type semiconductor region 208 represents an emitter region, and n-type semiconductor region 210 represents a collector region. Active region 204 can contain PNP semiconductor devices. The semiconductor die may also contain other active devices and IPDs, such as inductors, capacitors, and resistors, in active region 204.

An insulating layer 212 is formed on surface 203 of wafer 200 over active region 204. The insulating layer 212 can be SiO2, Si3N4, SiON, Ta2O5, ZrO2, Al2O3, or other material having suitable insulating properties. The insulating layer 212 is patterned or blanket deposited using PVD, CVD, printing, sintering, or thermal oxidation. In one embodiment, passivation layer 212 is formed by selective oxidation. The insulating layer 212 can be made with single or multiple layers. A portion of insulating layer 212 is removed by an etching process to expose semiconductor regions 206-210.

An electrically conductive layer 214 is formed over semiconductor regions 206-210 in the removed portions of insulating layer 212 using a patterning and deposition process. Conductive layer 214 is Al, Cu, Sn, Ni, Au, Ag, or other suitable material. The deposition of conductive layer 214 uses PVD, CVD, electrolytic plating, or electroless plating process. Each portion of conductive layer 214 is electrically isolated or electrically common according to the design of the die.

Figure 5B:
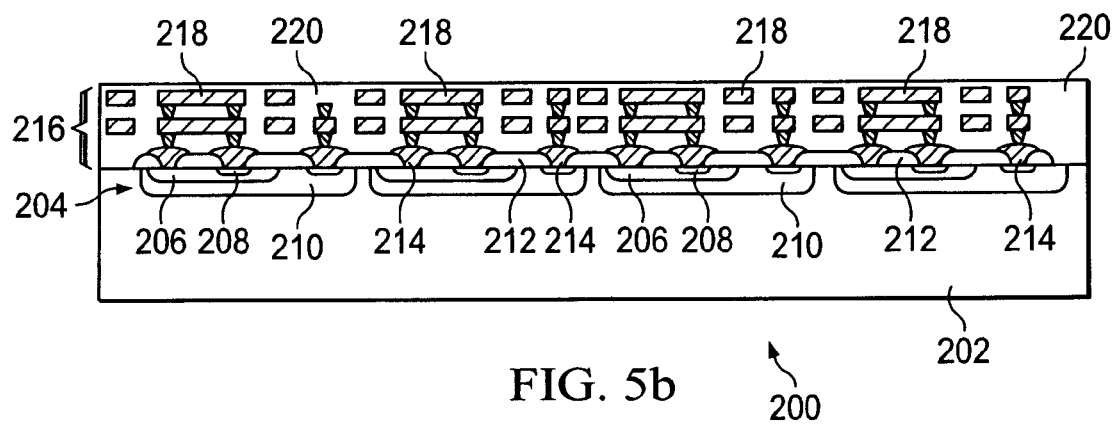

In FIG. 5b, a top-side interconnect structure 216 is formed over insulating layer 212 and conductive layer 214. The interconnect structure 216 includes conductive layers and signal traces 218, which are separated by insulating layer 220. The insulating layer 220 is Si3N4, SiO2, SiON, Ta2O5, ZnO, ZrO2, Al2O3, or other suitable dielectric material. The interconnect structure 216 electrically connects to the active and passive devices within active region 204, including semiconductor regions 206-210, to form functional electrical circuits according to the electrical design and function of the semiconductor die.

FIG. 5c shows a temporary process carrier or substrate 226 mounted to interconnect structure 216 with an adhesive layer 228. Carrier 226 contains dummy or sacrificial base material such as silicon, ceramic, glass, metal, or other suitable low-cost, rigid material. Adhesive layer 228 can be thermal epoxy, polymer composite or inorganic bonding compounds.

A back surface 230 of semiconductor wafer 200 undergoes CMP to remove defects. A through silicon via (TSV) 231 is formed through wafer 200 by trench etching with SiN mask or drilling process. TSV 231 is filled with conductive material such as titanium (Ti), tungsten (W), Cu, and Al.

Analog or digital circuits are formed in active region 232 on surface 230. The active devices include bipolar transistors, each having a base, emitter, and collector diffused into surface 230. The p-type semiconductor region 236 represents a base region of an NPN bipolar transistor. The n-type semiconductor region 238 represents an emitter region, and n-type semiconductor region 240 represents a collector region. The semiconductor die may also contain other active devices and IPDs in active region 232.

An insulating layer 242 is formed over active devices 232. The insulating layer 242 can be SiO2, Si3N4, SiON, Ta2O5, ZrO2, Al2O3, or other material having suitable insulating properties. The insulating layer 242 is patterned or blanket deposited using PVD, CVD, printing, sintering, or thermal oxidation. In one embodiment, insulating layer 242 is formed by selective oxidation with dry oxygen. The insulating layer 242 can be made with single or multiple layers. A portion of insulating layer 242 is removed by an etching process to expose semiconductor regions 236-240.

An electrically conductive layer 244 is formed over semiconductor regions 236-240 in the removed portions of insulating layer 242 using a patterning and deposition process. Conductive layer 244 is Al, Cu, Sn, Ni, Au, Ag, or other suitable material. The deposition of conductive layer 244 uses PVD, CVD, electrolytic plating, or electroless plating process. Each portion of conductive layer 244 is electrically isolated or electrically common according to the design of the die.

Figure 5D:
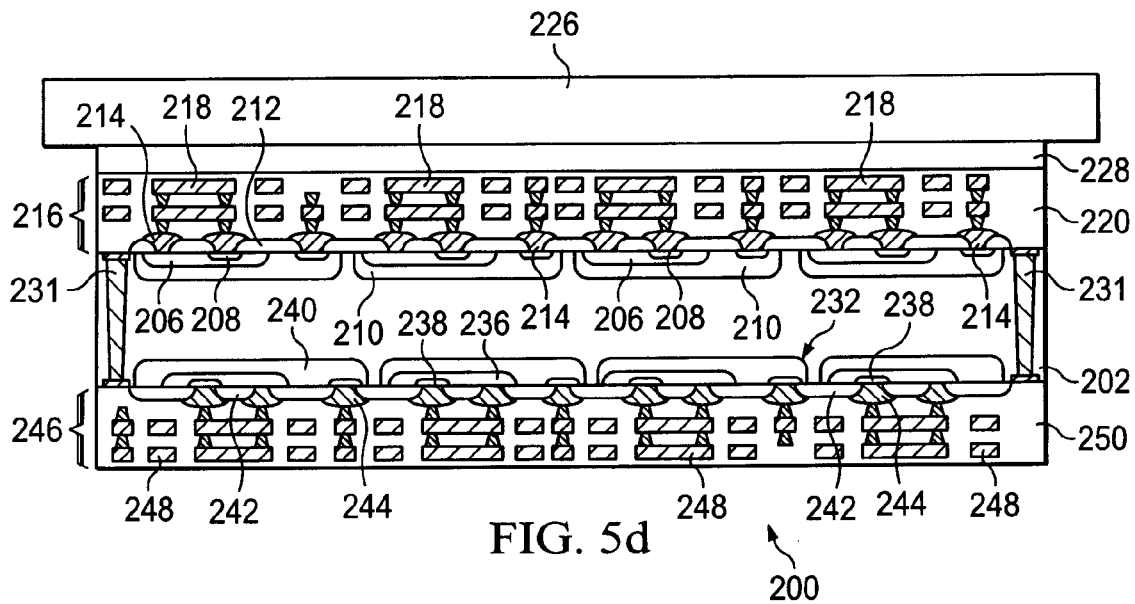

In FIG. 5d, a bottom-side interconnect structure 246 is formed over insulating layer 242 and conductive layer 244. The interconnect structure 246 includes conductive layers and signal traces 248, which are separated by insulating layer 250. The insulating layer 250 is Si3N4, SiO2, SiON, Ta2O5, ZnO, ZrO2, Al2O3, or other suitable dielectric material. The interconnect structure 246 electrically connects the active and passive devices within the semiconductor die, including semiconductor regions 236-240, to form functional electrical circuits according to the electrical design and function of the die.

Figure 5E:
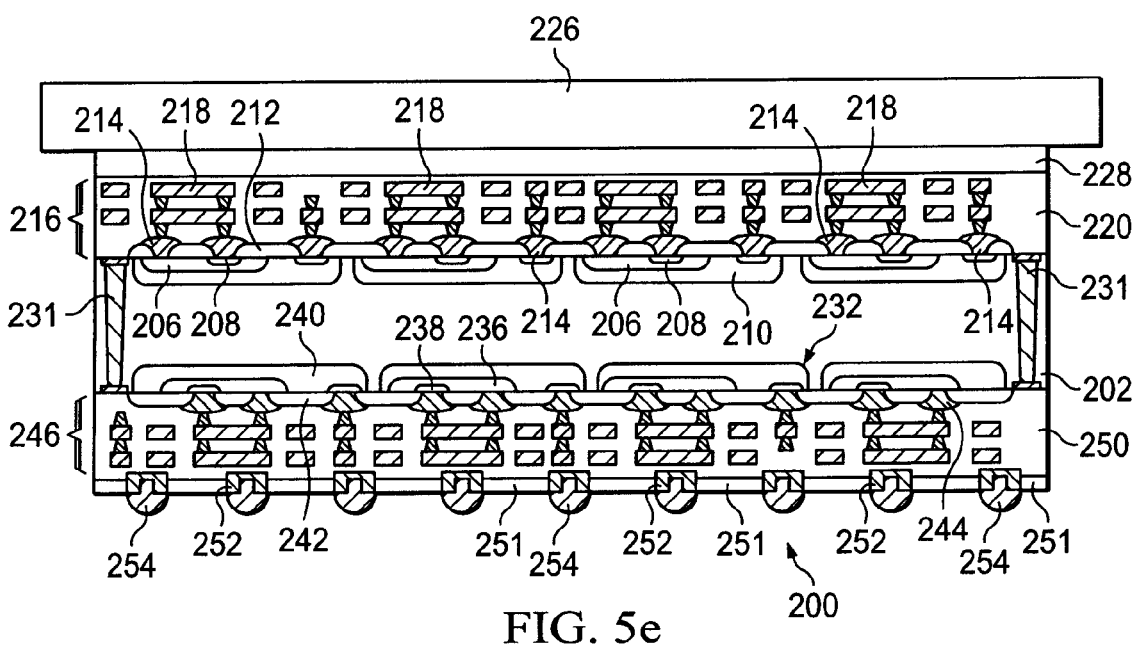

In FIG. 5e, an insulating layer 251 is formed over interconnect structure 246. The insulating layer 251 can be SiO2, Si3N4, SiON, Ta2O5, ZrO2, Al2O3, or other material having suitable insulating properties. The insulating layer 251 is patterned or blanket deposited using PVD, CVD, printing, sintering, or thermal oxidation. A portion of insulating layer 251 is removed by an etching process to expose conductive layer 248.

An electrically conductive layer 252 is formed over conductive layer 248 in the removed portion of insulating layer 251 using a patterning and deposition process. Conductive layer 252 is Al, Cu, Sn, Ni, Au, Ag, or other suitable material. The deposition of conductive layer 252 uses PVD, CVD, electrolytic plating, or electroless plating process. Conductive layer 252 operates as a UBM and electrically connects to conductive layer 248.

An electrically conductive solder material is deposited over UBM 252 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 254. In some applications, solder bumps 254 are reflowed a second time to improve electrical contact to UBM 252. Solder bumps 254 represent one type of interconnect structure that can be formed on UBM 252. The interconnect structure can also use bond wires, 3D interconnects, conductive paste, or other electrical interconnect.

Figure 5F:
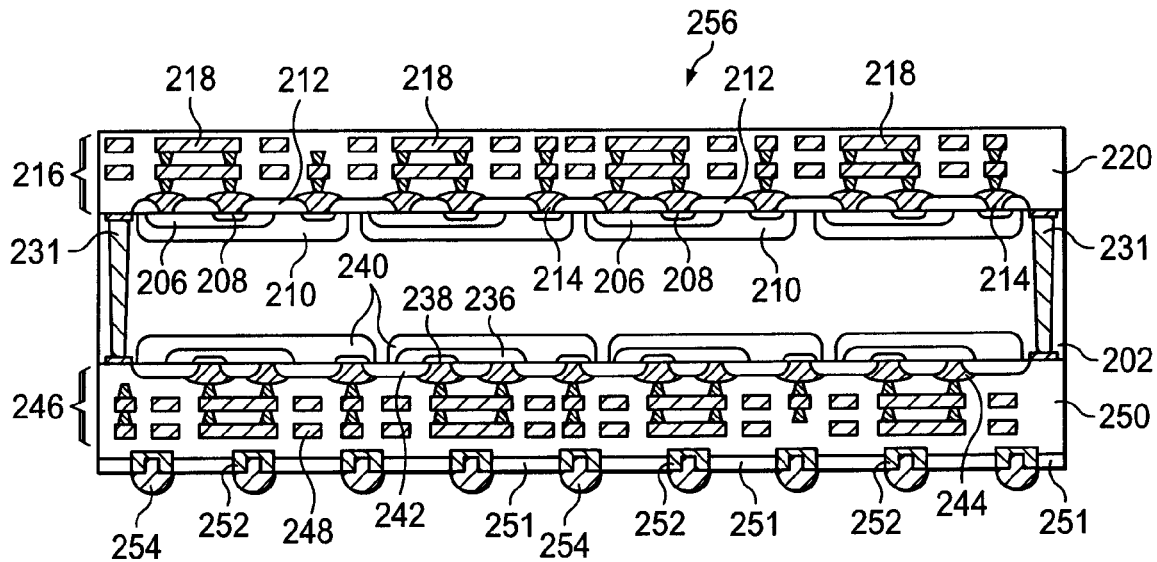

The temporary carrier 226 and adhesive layer 228 are removed in FIG. 5f by chemical etching, mechanical peel-off, CMP, or mechanical grinding. The resulting double-face semiconductor die 256 provides high-density, multi-functional integrated circuits, such as memory or ASIC. By placing active and passive devices on both sides of the wafer with respective interconnect structures, the semiconductor die can provide greater circuit functionality and interconnect capability.

Figure 6:
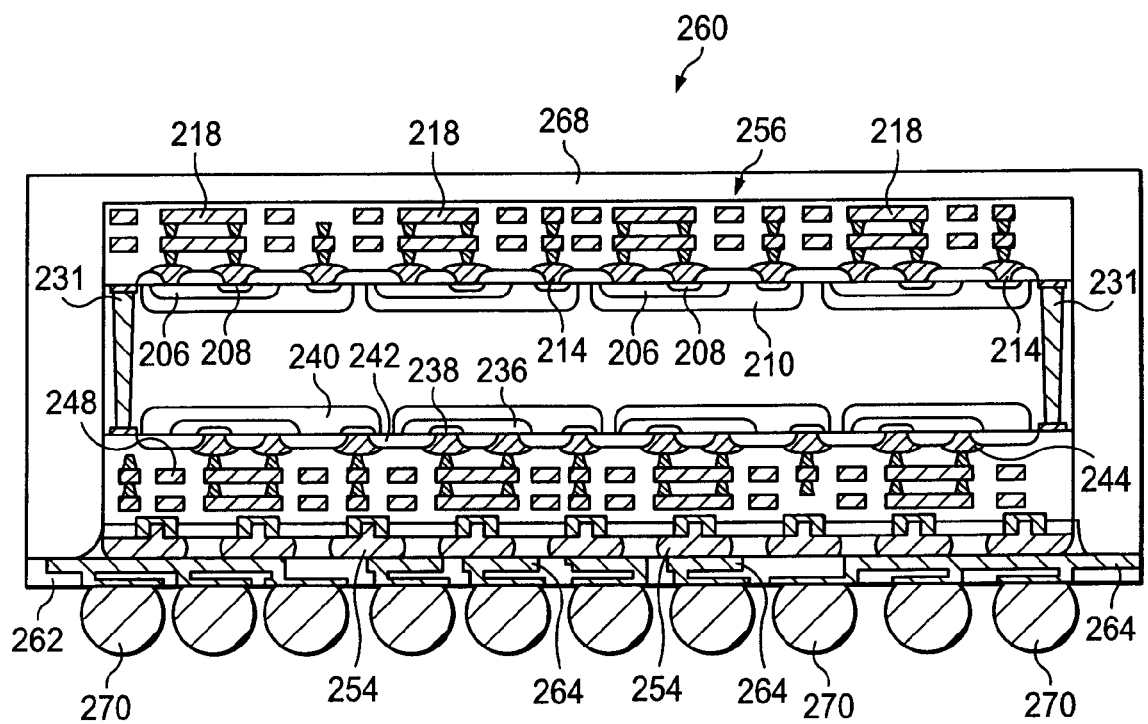
FIG. 6 illustrates the alternate double-sided semiconductor device with top-side and bottom-side interconnect structures and THV contained in a package.

FIG. 6 shows a semiconductor package 260 with double-face semiconductor die 256 mounted to substrate 262. Solder bumps 254 electrically connect semiconductor die 256 to interconnect structure 264 of substrate 262.

An encapsulant or molding compound 268 is deposited over double-face semiconductor die 256 using a printing, compressive molding, transfer molding, liquid encapsulant molding, or other suitable applicator. Encapsulant 268 can be epoxy resin, epoxy acrylate, polymer, or polymer composite material. Encapsulant 268 is non-conductive and environmentally protects the semiconductor device from external elements and contaminants.

An electrically conductive solder material is patterned and deposited over contact pads of interconnect structure 264 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 270. Solder bumps 270 represent one type of interconnect structure that can be formed on the contact pads of interconnect structure 264. The interconnect structure can also use bond wires, 3D interconnects, conductive paste, or other electrical interconnect. The semiconductor regions 206-210 and 236-240 electrically connect to external devices through interconnect structures 216, 246, and 264, solder bumps 252 and 270, and TVS 231.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of manufacturing a semiconductor device having a first active device, comprising:
   providing a semiconductor wafer;
   forming a first active device on a first side of the semiconductor wafer;

forming a first insulating layer over the first side of the semiconductor wafer;

forming a first conductive layer over the first insulating layer;

forming a first interconnect structure over the first insulating layer and first conductive layer, the first interconnect structure being electrically connected to the first active device through the first conductive layer;

mounting a pre-fabricated temporary carrier to the first interconnect structure;

after mounting the pre-fabricated temporary carrier, performing a chemical-mechanical polishing (CMP) process on a second side of the semiconductor wafer opposite the first side of the semiconductor wafer;

forming a second active device on a second side of the semiconductor wafer;

forming a second insulating layer over the second side of the semiconductor wafer;

forming a second conductive layer over the second insulating layer;

forming a second interconnect structure over the second insulating layer and second conductive layer, the second interconnect structure being electrically connected to the second active device through the second conductive layer;

forming a third insulating layer over the second interconnect structure; and removing the pre-fabricated temporary carrier.

2. The method of claim 1, wherein the first active device includes a bipolar transistor having a base region, emitter region, and collector region.

3. The method of claim 1, further including:
forming an under bump metallization layer over the third insulating layer, the under bump metallization layer being electrically connected to the second interconnect structure; and
forming an electrical interconnect over the under bump metallization layer.

4. The method of claim 1, further including:
forming a fourth insulating layer over the first interconnect structure; and
forming a third conductive layer over the fourth insulating layer, the third conductive layer being electrically connected to the first interconnect structure.

5. The method of claim 4, further including:
providing a substrate having an interconnect structure;
mounting the semiconductor device to the substrate;
electrically connecting the third conductive layer to the interconnect structure of the substrate; and
forming an encapsulant over the semiconductor device and substrate.

6. The method of claim 1, further including:
forming a through silicon via (THV) in the semiconductor wafer; and
filling the THV with conductive material.

7. The method of claim 6, further including:
providing a substrate having an interconnect structure;
mounting the semiconductor device to the substrate; and
electrically connecting the first and second interconnect structures to the interconnect structure of the substrate through the THV.

8. A method of manufacturing a semiconductor device having a first active device, comprising:
providing a semiconductor wafer;
forming a first active device on a first side of the semiconductor wafer;

forming a first interconnect structure over the first side of the semiconductor wafer, the first interconnect structure being electrically connected to the first active device;
mounting a temporary carrier to the first interconnect structure;
forming a second active device on a second side of the semiconductor wafer opposite the first side of the semiconductor wafer;
forming a second interconnect structure over the second side of the semiconductor wafer, the second interconnect structure being electrically connected to the second active device;
removing the temporary carrier;
forming a first insulating layer over the first side of the semiconductor wafer; and
forming a first conductive layer over the first insulating layer, the first conductive layer being electrically connected to the first interconnect structure.

9. The method of claim 8, wherein the first active device includes a bipolar transistor having a base region, emitter region, and collector region.

10. The method of claim 8, wherein forming the first interconnect structure includes:
forming a third insulating layer;
forming a third conductive layer over the third insulating layer.

11. The method of claim 8, further including:
providing a substrate having an interconnect structure;
mounting the semiconductor device to the substrate;
electrically connecting the first interconnect structure to the interconnect structure of the substrate; and
forming an encapsulant over the semiconductor device and substrate.

12. The method of claim 8, further including:
forming a through silicon via (THV) in the semiconductor wafer; and
filling the THV with conductive material.

13. The method of claim 12, further including:
providing a substrate having an interconnect structure;
mounting the semiconductor device to the substrate; and
electrically connecting the first and second interconnect structures to the interconnect structure of the substrate through the THV.

14. A method of manufacturing a semiconductor device having a first active device, comprising:
providing a semiconductor wafer;
forming a first active device on a first side of the semiconductor wafer;
forming a first interconnect structure over the first side of the semiconductor wafer, the first interconnect structure being electrically connected to the first active device;
forming a second active device on a second side of the semiconductor wafer opposite the first side of the semiconductor wafer;
forming a second interconnect structure over the second side of the semiconductor wafer, the second interconnect structure being electrically connected to the second active device.
forming a first insulating layer over the first side of the semiconductor wafer; and
forming a first conductive layer over the first insulating layer, the first conductive layer being electrically connected to the first active device.

15. The method of claim 14, wherein the first active device includes a bipolar transistor having a base region, emitter region, and collector region.

16. The method of claim 14, further including:
providing a substrate having an interconnect structure;
mounting the semiconductor device to the substrate;
electrically connecting the first interconnect structure to the interconnect structure of the substrate; and
forming an encapsulant over the semiconductor device and substrate.

17. The method of claim 14, further including:
forming a through silicon via (THV) in the semiconductor wafer; and
filling the THV with conductive material.

18. The method of claim 17, further including:
providing a substrate having an interconnect structure;
mounting the semiconductor device to the substrate; and
electrically connecting the first and second interconnect structures to the interconnect structure of the substrate through the THV.

19. The method of claim 1, wherein mounting the pre-fabricated temporary carrier comprises attaching the pre-fabricated temporary carrier to the first interconnect structure using an adhesive layer.

20. The method of claim 8, wherein mounting the temporary carrier comprises mounting a pre-fabricated, rigid material to the first interconnect structure.

21. The method of claim 14, further comprising attaching a rigid material to the first interconnect structure using an adhesive layer.

* * * * *